United States Patent [19]
Lin

[11] Patent Number: 6,074,910
[45] Date of Patent: Jun. 13, 2000

[54] SELF-ALIGNED STORAGE NODE DEFINITION IN A DRAM THAT EXCEEDS THE PHOTOLITHOGRAPHY LIMIT

[75] Inventor: Chenyong Frank Lin, San Jose, Calif.

[73] Assignee: Integrated Silicon Solution, Inc., Santa Clara, Calif.

[21] Appl. No.: 09/014,336

[22] Filed: Jan. 27, 1998

[51] Int. Cl.[7] ............................................... H01L 21/8242
[52] U.S. Cl. .................... 438/253; 438/254; 438/396; 438/397
[58] Field of Search ................... 438/253, 254, 438/396, 397

[56] References Cited

U.S. PATENT DOCUMENTS

| | | | |
|---|---|---|---|
| 5,192,702 | 3/1993 | Tseng | 438/253 |
| 5,354,716 | 10/1994 | Pors et al. | 438/396 |
| 5,381,365 | 1/1995 | Ajika et al. | |
| 5,591,664 | 1/1997 | Wang et al. | |
| 5,595,929 | 1/1997 | Tseng | |
| 5,652,164 | 7/1997 | Dennison et al. | |
| 5,661,063 | 8/1997 | Lee | |
| 5,665,624 | 9/1997 | Hong | |
| 5,670,404 | 9/1997 | Dai | |
| 5,672,533 | 9/1997 | Arima et al. | |
| 5,677,220 | 10/1997 | Shono et al. | |
| 5,677,227 | 10/1997 | Yang et al. | |
| 5,677,867 | 10/1997 | Hazani | |
| 5,679,595 | 10/1997 | Chen et al. | |
| 5,679,598 | 10/1997 | Yee | |
| 5,849,624 | 12/1998 | Fazan et al. | 438/398 |

*Primary Examiner*—John F. Niebling
*Assistant Examiner*—Jennifer N. Kennedy
*Attorney, Agent, or Firm*—Pennie & Edmonds LLP

[57] ABSTRACT

A method is provided for fabricating a stacked capacitor in a storage node (memory cell) of a dynamic random access memory (DRAM) that exceeds the photolithography limit. A DRAM has an array of memory cells and each memory cell has an associated capacitor. An array of memory cell transistors is formed and each memory cell transistor has a source, drain and gate. The drain is coupled to a bit line, and the gate coupled to a word line. A lower conductive layer is formed over the array of memory cell transistors. The lower conductive layer is electrically coupled to the source of each of the memory cell transistors. A protective layer is patterned and formed over a predetermined portion of the lower conductive layer for defining an inter-capacitor isolation region. A portion of the lower conductive layer is removed to form a bottom plate of the capacitor associated with each memory cell, such that a protected portion of the lower conductive layer under the protective layer is removed. The protective layer is removed. A temporary insulation layer is formed adjacent the lower conductive layer. A portion of the temporary insulation layer is removed to expose a portion of the lower conductive layer. The exposed portion of the lower conductive layer is removed so as to form an electrically separate capacitor bottom plate for each memory cell. The temporary insulation layer is removed. A capacitor dielectric is formed adjacent the lower conductive layer; and an upper conductive layer is formed adjacent the capacitor dielectric so as to form a top plate of the capacitor for each memory cell.

28 Claims, 4 Drawing Sheets

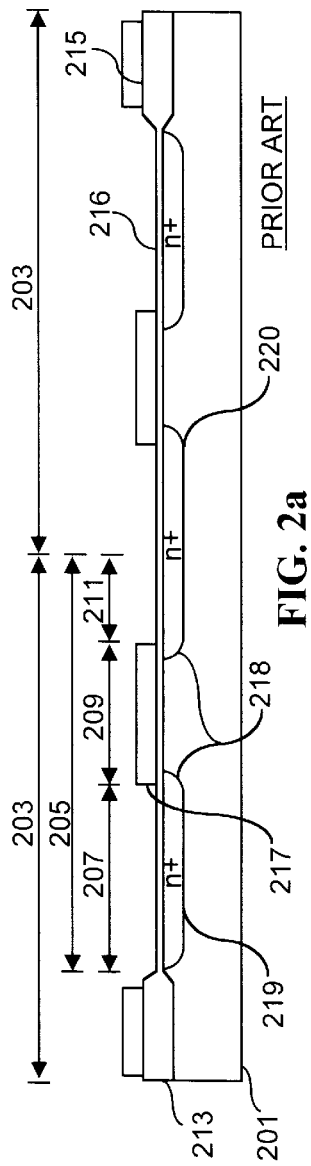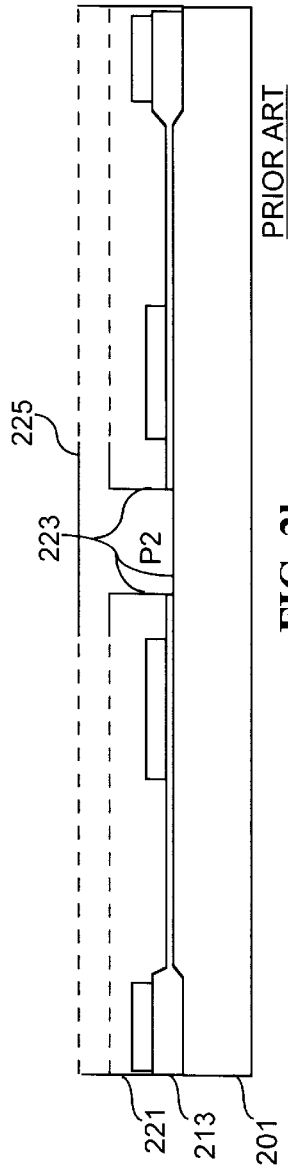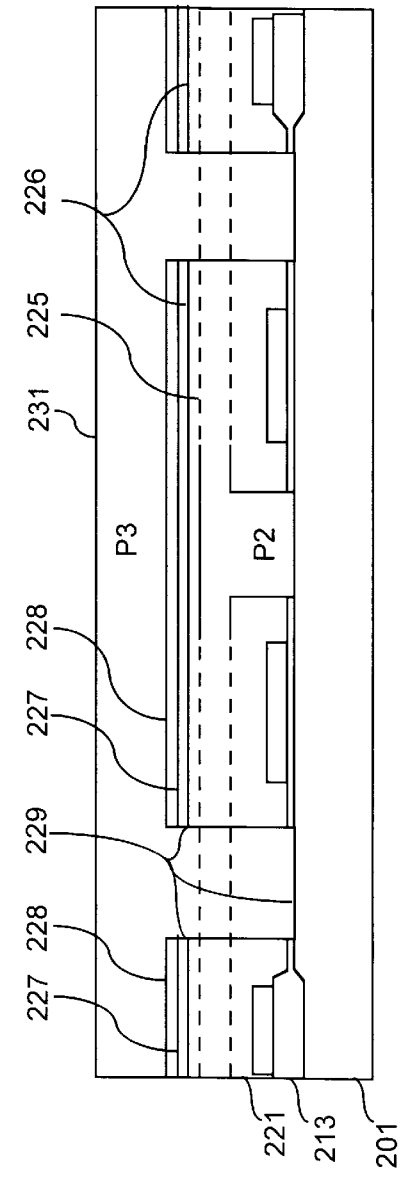

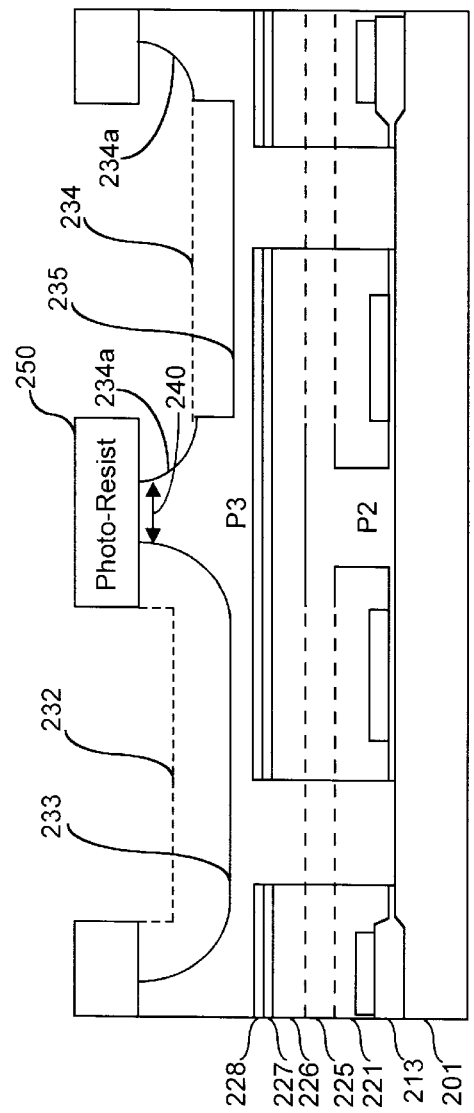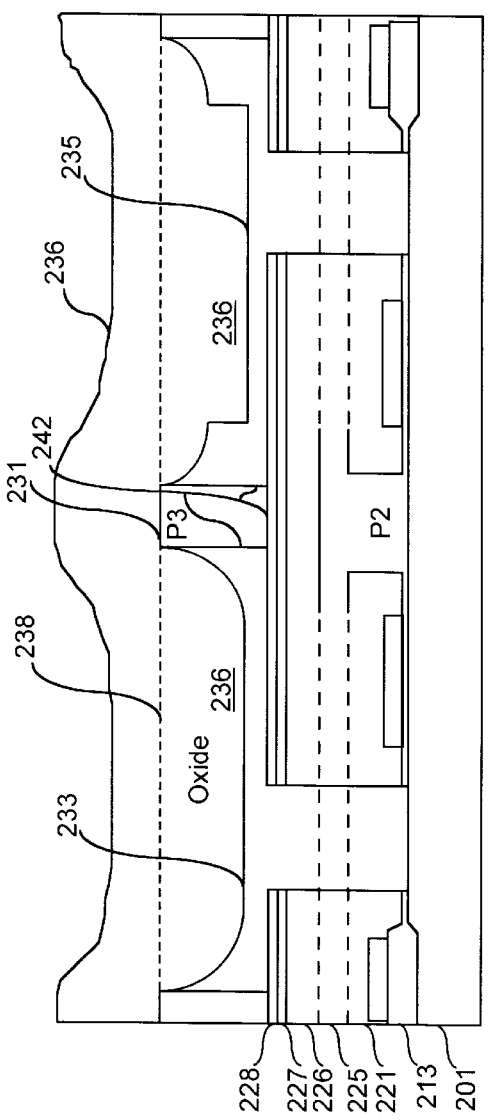

6,074,910

SELF-ALIGNED STORAGE NODE DEFINITION IN A DRAM THAT EXCEEDS THE PHOTOLITHOGRAPHY LIMIT

The present invention relates generally to a dynamic random access memory (DRAM), and particularly to defining a self-aligned storage node for a DRAM that exceeds the photolithography limit.

BACKGROUND OF THE INVENTION

A DRAM is a semiconductor device for storing digital information. Data, as digital information, can be written to and read from a DRAM. DRAMS are fabricated using integrated circuit technology.

A DRAM is made of many storage nodes or memory cells and each memory cell has a memory cell transistor and a capacitor. The capacitor is an important element of the memory cell because it stores the digital information. Trench capacitors and stack capacitors are the two major types of DRAM cell capacitors.

The higher the capacitance of the capacitor the better. Higher capacitance improves the data sensing margin and the shrinkability of the memory cell. One way to increase capacitance is to increase the surface area of the capacitor (capacitor area). The trench capacitor increases the capacitor area by digging a deep trench inside the bulk silicon. The stack capacitor increases the capacitor area by raising the height of the capacitor above the surface of the silicon wafer. One particular type of stack capacitor has a cylindrical shape to increase the capacitor area without increasing the area and height of the memory cell. Stack capacitors are also referred to as capacitor-over-bit-line (COB) capacitors.

DRAM density is ever-increasing and the size of memory cell area on the DRAM chip is decreasing. Each memory cell capacitor uses a large amount of space on the DRAM. The need for memory cell capacitors to be isolated from each other also uses space. To increase DRAM density, a method is needed to further increase the size of the DRAM memory cell capacitor and to decrease the spacing between memory cell capacitors.

SUMMARY OF THE INVENTION

A method is provided for fabricating a stacked capacitor in a storage node (memory cell) of a dynamic random access memory (DRAM) that exceeds the photolithography limit.

A DRAM has an array of memory cells and each memory cell has an associated capacitor. An array of memory cell transistors is formed and each memory cell transistor has a source, a drain and a gate. The drain is coupled to a bit line, and the gate is coupled to a word line. A lower conductive layer is formed over the array of memory cell transistors and is electrically coupled to the source of each of the memory cell transistors. A protective layer is patterned and formed over a portion of the lower conductive layer for defining an inter-capacitor isolation region. A portion of the lower conductive layer is removed to form a bottom plate of the capacitor associated with each memory cell, such that a protected portion of the lower conductive layer under the protective layer is removed. The protective layer is removed and a temporary insulation layer is formed adjacent the lower conductive layer. A portion of the temporary insulation layer is removed to expose a portion of the lower conductive layer. The exposed portion of the lower conductive layer is removed so as to form an electrically separate capacitor bottom plate for each memory cell. The temporary insulation layer is removed. A capacitor dielectric is formed adjacent the lower conductive layer; and an upper conductive layer is formed adjacent the capacitor dielectric to function as a top plate of the capacitor for each memory cell.

BRIEF DESCRIPTION OF THE DRAWINGS

FIG. 2a shows the formation of the memory cell transistor and the word lines.

FIG. 2b shows the formation of the bit line.

FIG. 2c shows the formation of the capacitor contact region with the memory cell transistor.

FIG. 2d shows the formation of the capacitor bottom plate.

FIG. 2e shows additional steps in the formation of the capacitor bottom plate.

DESCRIPTION OF THE PREFERRED EMBODIMENTS

Figure 1:
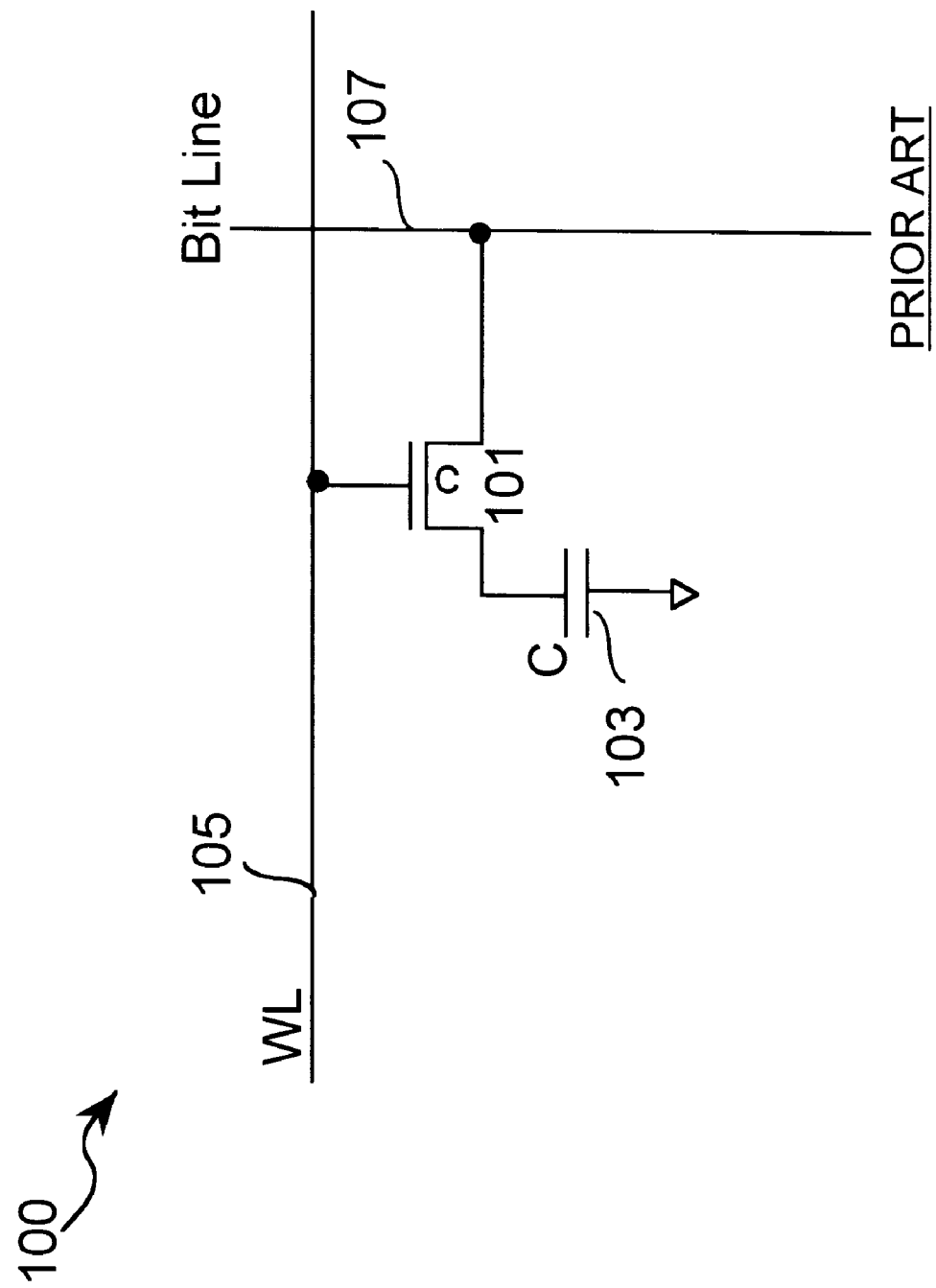
FIG. 1 is a schematic diagram of a DRAM memory cell using a stacked capacitor fabricated by the method of the present invention.

FIG. 1 is a schematic diagram of a DRAM memory cell 100 using the stacked capacitor fabricated by the method of the present invention. A DRAM has many memory cells 100. Typically, each memory cell 100 comprises a combination of a memory cell transistor 101 and a capacitor C 103. In the memory cell 100, digital information is represented by a charge stored in the capacitor C 103. When a memory cell 100 stores a one value, the capacitor 103 is charged, and when the memory cell 100 stores a zero value, the capacitor 103 is discharged. However, the present invention is equally applicable when a charged capacitor 103 is used to store a zero value and a discharged capacitor 103 is used to store a one value.

The capacitor 103 will lose any stored charge unless it is regularly recharged or refreshed. Also, reading the information stored in the memory cell 100 destroys the contents of the memory cell. More specifically, after a memory cell 100 that previously had a charged capacitor 103 has been read, the amount of charge remaining on the capacitor 103 is not sufficient to distinguish it from a memory cell 100 having a discharged capacitor 103. As a result, the information previously stored in the memory cell 100 needs to be restored after it has been read. Also, the memory cell 100 needs to be periodically refreshed to prevent the information stored by the memory cell 100 from being lost due to charge leakage.

Each memory cell 100 is connected to a word-line (WL) 105 and a bit-line 107. A word-line driver restores the contents of the memory cell 100. To restore a "one" level to the memory cell capacitor C 103, the word line driver must output a voltage on the word line 105 that exceeds the voltage present on the bit-line 107. Since the maximum voltage that will be present on the bit line 107 after a read operation is the supply voltage Vcc, the word line driver must generate a voltage that exceeds Vcc. Typically, the word line driver is a charge pump circuit that generates a voltage that exceeds the supply voltage Vcc.

The capacitor 103 has two plates separated by a dielectric. One plate of the capacitor 103 is connected to the drain of the memory cell transistor 101. The other plate of the capacitor 103 is connected to ground. The word line 105 is connected to the gate of the memory cell transistor 101. The bit line 107 is connected to the source of the memory cell transistor 101. Alternatively, the drain of the memory cell transistor 101 can be connected to the bit line 107 and the source of the memory cell transistor 101 can be connected to the capacitor 103.

Figure 2F:
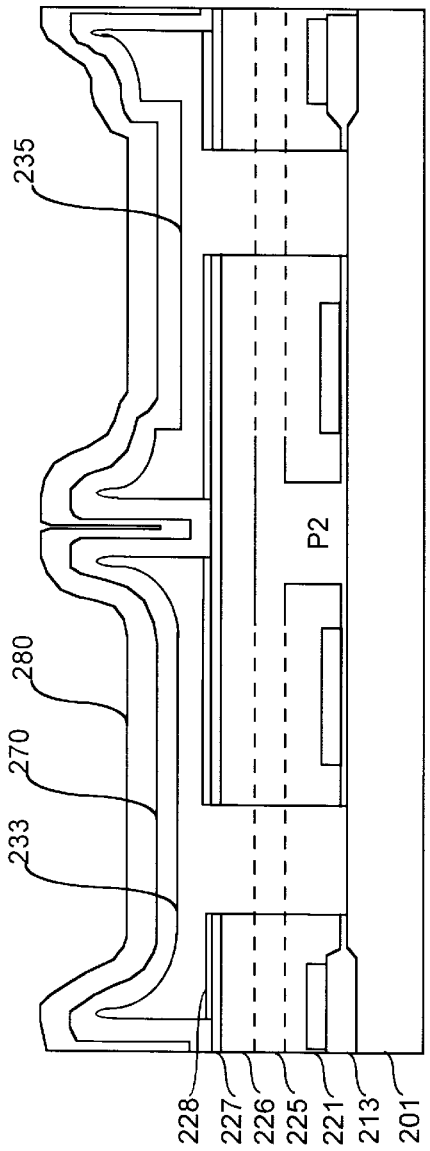
FIG. 2f shows the formation of the capacitor dielectric and top plate.

FIGS. 2a–2h show a method of the present invention for fabricating a self-aligned memory cell 100 (storage node) for a DRAM that exceeds the photolithography limit. FIGS. 2a and 2b show well-known steps to form the memory cell transistor 101, the word line 105 and the bit line 107 in a stacked capacitor structure.

FIG. 2a shows the formation of the memory cell transistor and the word lines 105. A substrate 201 has two memory cell regions 203 and each memory cell region 203 contains a memory cell. The substrate 201 can be silicon. The memory cell region 203 has a memory cell transistor area 205 including a source area 207, a gate area 209 and a drain area 211. In an alternative embodiment, the source and drain areas can be reversed.

An interlayer dielectric (ILD) 213 is adjacent the substrate 201. The ILD 213 is partially shown to simplify the description and is well-known. First, field oxide is formed in inactive regions. Selected portions of the substrate 201 are masked against oxidation and the exposed unmasked surface is oxidized. The exposed unmasked areas remain as high areas 215 making up a field-oxide-pattern (FOX). The high areas 215 form dielectric isolation regions for isolating semiconductor surface regions from other such regions in the substrate 201. Next, the surface of the substrate 201 is thermally oxidized to form the oxide layer to a desired thickness in the unmasked areas of the substrate 201. As a result, the high areas 215 are surrounded by low areas having a reduced oxide thickness 216.

The word line (WL) 105 is made of a first conductive material and can comprise a first polysilicon layer 217 or a combination of polysilicon and metal silicide layers. The metal silicide layer can be tungsten silicide ($WSi_2$) or cobalt silicide ($CoSi_2$). The first polysilicon layer 217 can be doped. The word lines 105 are patterned using conventional lithography and anisotropic etching techniques. Alternatively, the word lines can be formed using a composite layer. To form the composite layer, a layer of polysilicon is deposited by a low pressure chemical vapor deposition (LPCVD) process, then a metal silicide layer is deposited on top of the polysilicon layer using a LPCVD process. The word lines 105 of the DRAM connect the gates of the memory cell transistors in a desired pattern.

The formation of memory cell transistors 101 is well-known. A lithographic mask exposes the source and drain areas, 207 and 211 respectively, and the exposed areas of the substrate 201 are doped with ions 218 to form a source 219 and drain 220. N-type ions are implanted to produce an n-channel transistor, and P-type ions are implanted to produce a p-channel transistor. Typically, the memory cell 100 comprises an n-channel transistor.

For simplicity, the source and drain components of the memory cell transistor will not be shown in subsequent drawings although they are present.

FIG. 2b shows the formation of the bit line 107. A first insulation layer 221 is formed over the surface adjacent the word lines and is made of a material comprising oxide, such as $SiO_2$. The first insulation layer 221 can be patterned using conventional lithographic and etching techniques to form a bit-line opening 223 in the first insulation layer 221 for the bit line to contact the drain area 211.

The bit line 107 is then formed by depositing a second conductive layer 225, such as second polysilicon layer (P2) or a combination of polysilicon and metal silicide layers, over the first insulation layer 221. The metal silicide layer can be tungsten silicide ($WSi_2$) or cobalt suicide ($CoSi_2$). The second polysilicon layer 225 can be doped. The second conductive layer 225 fills the bit-line opening 223 in the insulation layer 221 and electrically contacts the drain area 211. The deposition process can form the bit line using doped polysilicon deposited by a LPCVD process. Alternatively, the bit line can be formed using a composite layer. To form the composite layer, a layer of polysilicon is deposited by a LPCVD process, then a metal silicide layer is deposited on top of the polysilicon layer using a LPCVD process. The metal silicide layer reduces the sheet resistance of the polysilicon layer.

The dotted lines in FIG. 2b are used to show that the bit-line extends across the DRAM. In FIG. 2b and subsequent figures, the bit-line is behind, and does not contact, the area in which the capacitor will be formed.

FIG. 2c shows the formation of the capacitor contact where the bottom plate of the capacitor 103 contacts the source 219 of the memory cell transistor 101 in a portion of the source region 207. A second insulation layer 226 is formed over the bits lines 225. The second insulation layer 226 comprises oxide, such as $SiO_2$ or a composite of $SiO_2$ and spin-on-glass (SOG), and is deposited using well-known deposition techniques such as LPCVD or spin coating. The second insulation layer 226 is planarized (providing a flat surface) using a chemical-mechanical polish (CMP) process. Alternatively, a plasma etch back process can be used to planarize the composite layer of $SiO_2$ and SOG.

An etch-stop layer 227 is formed of a material such as silicon nitride ($Si_3N_4$) and is about 200 angstroms (Å) thick. An etch-stop cover layer 228 such as an oxide layer is then deposited adjacent the etch stop layer 227. The etch stop layer 227 and etch-stop cover layer 228 can be formed using LPCVD deposition techniques.

A capacitor opening 229 is formed over a portion of the source region 207 and extends to the substrate 201 so that the bottom plate of the capacitor 103 will electrically contact a portion of the transistor's source 219 in the source area 207 of the memory cell transistor 100. The bottom plate of the capacitor 103 is formed. A third conductive layer 231, such as a third polysilicon layer (P3) is deposited and fills the capacitor opening 229. The third polysilicon layer can be doped. A LPCVD process can be used to deposit the third polysilicon layer.

The desired amount of capacitance (capacitance value) is a function of the height, shape and thickness of the capacitor sidewalls. The thickness of the third conductive layer 231 is a factor in defining the height and shape of the capacitor sidewalls. Preferably, the capacitor sidewalls have a height of about 4,000 Å. The height of the capacitor sidewall is determined by the cell area. A smaller cell area implies a smaller capacitor area. To compensate for a smaller cell area, a higher capacitor sidewall is used to provide sufficient capacitance (about thirty fem-to-farads per cell).

FIG. 2d shows the formation of the bottom plates 233, 235 of the capacitors and an inter-capacitor isolation region 240. A protective layer 250 such as a photoresist is applied to or spun onto the surface and then patterned. The patterned protective layer 250 is used to help define the width of the inter-capacitor isolation region 240 that separates capacitors 103 in adjacent memory cells 100. The inter-capacitor isolation region 240 can be formed using one of two methods.

In a first method, the third conductive layer 231 is first anisotropically etched resulting in the shape shown by dashed line 232. The third conductive layer 231 is then isotropically etched resulting in the shape shown by line 233. The upper portion of the bottom plate of the capacitor formed by the first method is U-shaped.

The anisotropic and isotropic etch processes define the shape and thickness of the capacitor sidewalls. The minimum width of the inter-capacitor isolation region 240 can be about 1,200 Å with a deviation of ±200 Å.

In a second method, the third conductive layer 231 is first isotropically etched resulting in the shape shown by dashed line 234 and solid lines 234a. The third conductive layer 231 is then anisotropically etched resulting in the shape shown by line 235 and solid lines 234a. The upper portion of the bottom plate of the capacitor formed by the second method has substantially perpendicular sidewalls and the upper surface of the sidewalls curves from a high point at an outer edge of the capacitor to a lower point inside the capacitor. The minimum width of the inter-capacitor isolation region 240 can be about 1,200 Å with a deviation of ±200 Å.

For both methods, the capacitor sidewalls are preferably about 400 to 600 Å±100 Å thick below the curved top edge.

In both methods, the isotropic etch process can be a plasma-etch process. The isotropic etch undercuts the area defined by the photo-resist. The photolithography process has a limit for the smallest area that can be defined by the protective layer 250. As a result, the undercutting of the protective layer 250 by the isotropic etch defines and results in an inter-capacitor isolation region 240 that has a width that exceeds (is smaller than) than photolithography limit. Therefore, the distance between memory cells exceeds the photolithography limit. The photolithography limit is 1,800 to 2,500 Å for deep ultra violet (DUV) steppers, and the inter-capacitor isolation region 240 is about 1,200 Å with a deviation of ±200 Å.

FIG. 2e shows additional steps in the formation of the capacitor bottom plate. The protective layer 250 is removed. A third insulation layer 236 such as an oxide layer is deposited to fill the interior of the capacitor bottom plate 233, 235. The surface of the third insulation layer 236 is planarized and a portion of the third insulation layer 236 is removed to expose the third conductive layer 231 using a chemical-mechanical polish (CMP) process. The result of the planarization is shown by dashed line 238. The amount of material removed is predetermined and is a factor in determining the width of the inter-capacitor isolation region 240 and the surface area of the capacitors. The width of the inter-capacitor isolation region 240 increases as more material of the third conductive layer 231 is removed. After the CMP process, portions 242 of the third conductive layer 231 are selectively etched using the third insulation layer 236 as an etching mask. The etch stops at the etch-stop cover layer 28. Then the third insulation layer 236 is removed by wet etch and stops at the etch stop layer 227.

FIG. 2f shows the rounding of the top corners of the capacitor, formation of the capacitor dielectric and top plate. The third insulation layer 236 is removed using a wet etch and stops at the etch stop layer 227. The bottom plate of the capacitor is now exposed. The top corners of the bottom plate of the capacitor have sharp edges that will degrade the performance of the capacitor. To remove the sharp edges, the top corners are rounded using thermal oxidation and a wet oxide dip.

In addition, the capacitor area can be further increased by depositing hemisphere-grain (HSG) polysilicon. HSG poly-silicon is a polysilicon layer with a very rough surface that is deposited using special LPCVD conditions. If HSG is used, it is deposited after the cylinder opening etch and before the third insulation layer 236 is deposited.

A dielectric layer 270 is formed on the surface of the bottom plate of the capacitor. A conformal deposition process can be used to form the dielectric layer 270. The dielectric layer 270 can be a thermal oxide, silicon nitride or $Ta_2O_5$ layer. Alternatively, the dielectric layer 270 is a composite layer such as oxide-nitrideoxide (ONO) in which both oxide layers are thermally grown. For higher capacitance, $Ta_2O_5$ is used.

After forming the dielectric layer 270, a fourth conductive layer 280 is formed adjacent the dielectric layer 270 to function as a top plate 280 of the capacitor using conductive material. The fourth conductive layer 280 can be common to all the capacitors. The fourth conductive layer 280 can be made of doped polysilicon and can be deposited using a LPCVD process.

Figure 2G:
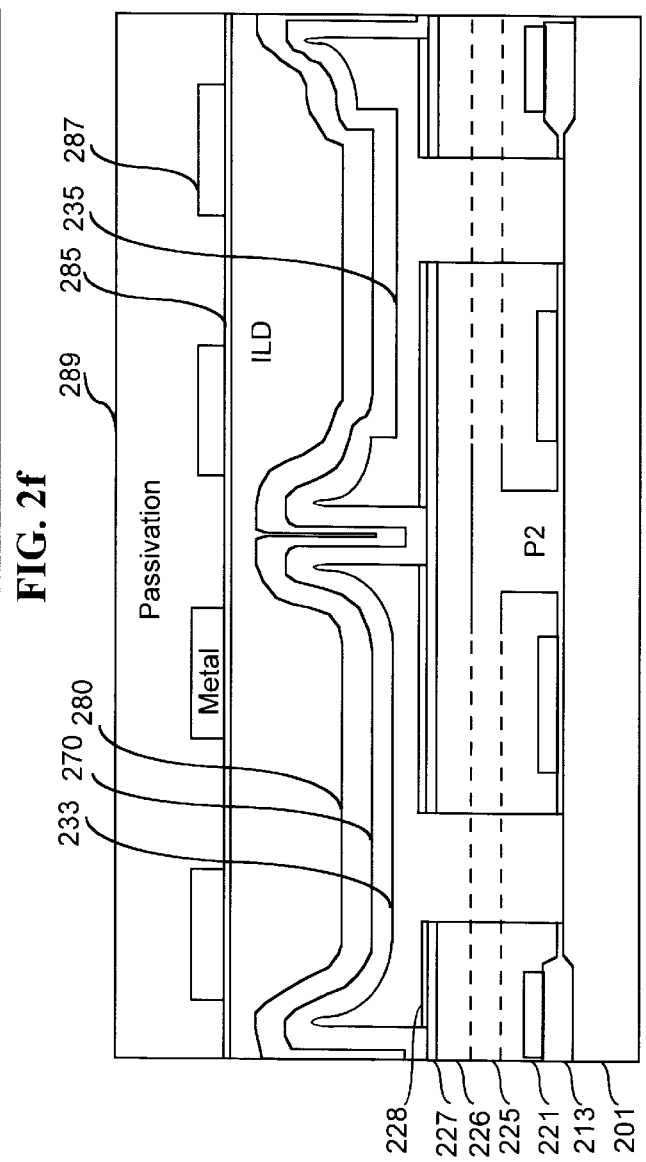
FIG. 2g shows the formation of the inter-layer dielectric, metalization and passivation layers.

FIG. 2g shows the formation of a fourth insulation layer 285 or inter-layer dielectric (ILD), a metalization layer 287 and a passivation layer 289 to complete the manufacturing process of the memory cell of the DRAM.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method for fabricating an array of memory cells for a dynamic random access memory, each memory cell having an associated capacitor, comprising:

forming an array of memory cell transistors, one for each memory cell, each having a source, a drain coupled to a bit line, and a gate coupled to a word line;

forming a lower conductive layer over the array of memory cell transistors, the lower conductive layer being electrically coupled to the source of each of the memory cell transistors;

patterning and forming a protective layer over a predetermined portion of the lower conductive layer to define an isolation region, the protective layer being continuous over the isolation region, the protective layer having a gap to define an interior portion of a bottom electrode of the capacitor;

removing a portion of the lower conductive layer under the protective layer to define the shape of the interior portion of the bottom electrode;

removing the protective layer;

forming an insulation layer adjacent the lower conductive layer;

removing a portion of the insulation layer to expose a portion of the lower conductive layer;

removing the exposed portion of the lower conductive layer so as to form an electrically separate bottom plate of the capacitor associated with each memory cell;

removing the insulation layer;

forming a capacitor dielectric adjacent the lower conductive layer; and forming an upper conductive layer adjacent the capacitor dielectric so as to form a top plate of the capacitor associated with each memory cell.

2. The method of claim 1 wherein the removing of the portion of the lower conductive layer comprises:

isotropically etching the lower conductive layer, and anisotropically etching the lower conductive layer.

3. The method of claim 2 wherein the anisotropic etch is performed before the isotropic etch to form the bottom plate of the capacitor in a U-shape.

4. The method of claim 2 wherein the isotropic etch is performed before the anisotropic etch to form the bottom plate of the capacitor with substantially perpendicular sidewalls, the upper surface of the sidewalls being curved from a high point at an outer edge of the capacitor to a lower point inside the capacitor.

5. The method of claim 2 wherein the isotropic etch is a plasma etch process.

6. The method of claim 1 wherein the protective layer is patterned and formed using a photo-lithography process, the photo-lithography process being capable of forming areas having a predetermined minimum photolithography width, and the isolation region having a width less than the predetermined minimum photolithography width.

7. The method of claim 1 further comprising:

rounding the top corners of the lower conductive layer after the removing of the insulation layer.

8. A method for fabricating an array of memory cells for a dynamic random access memory, each memory cell having an associated capacitor, comprising the steps of:

forming an array of memory cell transistors, one for each memory cell, each having a source, a drain coupled to a bit line, and a date coupled to a word line;

forming a lower conductive layer over the array of memory cell transistors, the lower conductive layer being electrically coupled to the source of each of the memory cell transistors;

patterning and forming a protective layer over a predetermined portion of the lower conductive layer for defining an inter-capacitor isolation region;

removing a portion of the lower conductive layer, such that a protected portion of the lower conductive layer under the protective layer is removed;

removing the protective layer;

forming a temporary insulation layer adjacent the lower conductive layer;

removing a portion of the temporary insulation layer to expose a portion of the lower conductive layer;

removing the exposed portion of the lower conductive layer so as to form an electrically separate bottom plate of the capacitor associated with each memory cell;

removing the temporary insulation layer;

rounding top corners of the lower conductive layer after the step of removing the temporary insulation layer, wherein the rounding the top corners of the lower conductive layer comprises a thermal oxidation process and a wet oxide dip;

forming a capacitor dielectric adjacent the lower conductive layer; and forming an upper conductive layer adjacent the capacitor dielectric so as to form a top plate of the capacitor associated with each memory cell.

9. The method of claim 1 wherein the lower and the upper conductive layers comprise polysilicon.

10. The method of claim 1 wherein the forming the capacitor dielectric is a conformal deposition.

11. The method of claim 1 wherein the protective layer is a photo-resist.

12. The method of claim 1 further comprising:

depositing an etch-stop layer after forming an array of memory cell transistors.

13. The method of claim 12 wherein the etch-stop layer is silicon nitride.

14. A method for fabricating an array of memory cells for a dynamic random access memory, comprising:

forming a memory cell transistor area on a substrate, the memory cell transistor area having a source area, a gate area and a drain area;

forming a memory cell transistor in the memory cell transistor area, the memory cell transistor having a source in the source area, a gate in the gate area and a drain in the drain area;

forming a first conductive layer in the gate area to form a word line;

forming a first insulation layer over the formed memory cell transistor and lower conductive layer;

removing a portion of the first insulation layer adjacent the memory cell transistor area to reach the drain area to form a bit-line opening;

forming a second conductive layer, the second conductive layer filling the bit-line opening to electrically connect the drain area and to form a bit line;

forming a second insulation layer over the second conductive layer;

forming an etch-stop layer over the second insulation layer;

removing a portion of the second insulation layer and the etch-stop layer over a portion of the source area to form a capacitor opening reaching the source area of the memory cell transistor;

forming a third conductive layer, the third conductive layer filling the capacitor opening and electrically connecting to the source of the memory cell transistor;

patterning and forming a protective layer over a predetermined portion of the third conductive layer to define an isolation region, the protective layer being continuous over the isolation region, the protective layer having a gap to define an interior portion of a bottom electrode of the capacitor;

removing a portion of the third conductive layer under the protective layer to define the shape of the interior portion of the bottom electrode;

removing the protective layer;

forming a third insulation layer adjacent the third conductive layer;

removing a portion of the third insulation layer to expose a portion of the third conductive layer;

removing the exposed portion of the third conductive layer until the etch-stop layer is reached, so as to form an electrically separate bottom plate of the capacitor associated with each memory cell;

removing the third insulation layer;

forming a capacitor dielectric adjacent the third conductive layer; and forming a fourth conductive layer adjacent the capacitor dielectric so as to form a top plate of the capacitor associated with each memory cell.

15. The method of claim 14 wherein the removing of the portion of the third conductive layer comprises:

isotropically etching the third conductive layer, and anisotropically etching the third conductive layer.

16. The method of claim 15 wherein the anisotropic etch is performed before the isotropic etch to form the bottom plate of the capacitor in a U-shape.

17. The method of claim 15 wherein the isotropic etch is performed before the anisotropic etch to form the bottom plate of the capacitor with substantially perpendicular sidewalls, the upper surface of the sidewalls being curved from a high point at an outer edge of the capacitor to a lower point inside the capacitor.

18. The method of claim 15 wherein the isotropic etch is a plasma etch process.

19. The method of claim 14 wherein the protective layer is patterned and formed using a photo-lithography process, the photo-lithography process being capable of forming areas having a predetermined minimum photo-lithography width, and the inter-capacitor isolation region having a width less than the predetermined minimum photo-lithography width.

20. A method for fabricating an array of memory cells for a dynamic random access memory, comprising the steps of:

forming a memory cell transistor area on a substrate, the memory cell transistor area having a source area, a gate area and a drain area;

forming a memory cell transistor in the memory cell transistor area, the memory cell transistor having a source in the source area, a sate in the sate area and a drain in the drain area;

forming a first conductive layer in the gate area to form a word line;

forming a first insulation layer over the formed memory cell transistor and lower conductive layer;

removing a portion of the first insulation layer adjacent the memory cell transistor area to reach the drain area to form a bit-line opening;

forming a second conductive layer, the second conductive layer filling the bit-line opening to electrically connect the drain area and to form a bit line;

forming a second insulation layer over the second conductive layer;

forming an etch-stop layer over the second insulation layer;

removing a portion of the second insulation layer and the etch-stop layer over a portion of the source area to form a capacitor opening reaching the source area of the memory cell transistor;

forming a third conductive layer, the third conductive layer filling the capacitor opening and electrically connecting to the source of the memory cell transistor;

patterning and forming a protective layer over a predetermined portion of the third conductive layer for defining an inter-capacitor isolation region;

removing a portion of the third conductive layer, such that a protected portion of the third conductive layer under the protective layer is removed;

removing the protective layer;

forming a third insulation layer adjacent the third conductive layer;

removing a portion of the third insulation layer to expose a portion of the third conductive layer;

removing the exposed portion of the third conductive layer until the etch-stop layer is reached, so as to form an electrically separate bottom plate of the capacitor associated with each memory cell;

removing the third insulation layer;

rounding top corners of the third conductive layer, wherein the rounding comprises a thermal oxidation process and a wet oxide dip;

forming a capacitor dielectric adjacent the third conductive layer; and forming a fourth conductive layer adjacent the capacitor dielectric so as to form a top plate of the capacitor associated with each memory cell.

21. A method for fabricating a capacitor, comprising:

forming a lower conductive layer;

forming a patterned protective layer over a predetermined portion of the lower conductive layer for defining an isolation region, the protective layer being continuous over the isolation region, the protective layer having a gap for defining an interior portion of a bottom electrode;

shaping the lower conductive layer to form the interior portion of the bottom electrode by removing a portion of the lower conductive layer under the protective layer;

removing the protective layer to expose the isolation region;

removing at least a portion of the lower conductive layer in the isolation region;

forming a capacitor dielectric adjacent the lower conductive layer; and forming an upper conductive layer adjacent the capacitor dielectric so as to form a top plate of the capacitor.

22. The method of claim 21 wherein the shaping the lower conductive layer to form the interior portion of the bottom electrode, comprises:

isotropically etching the lower conductive layer, and anisotropically etching the lower conductive layer.

23. The method of claim 22 wherein the anisotropic etch is performed before the isotropic etch to form the bottom plate of the capacitor in a U-shape.

24. The method of claim 22 wherein the isotropic etch is performed before the anisotropic etch to form the bottom plate of the capacitor with substantially perpendicular sidewalls, the upper surface of the sidewalls being curved from a high point at an outer edge of the capacitor to a lower point inside the capacitor.

25. The method of claim 22 wherein the isotropic etch is a plasma etch process.

26. The method of claim 21 wherein the protective layer is patterned and formed using a photo-lithography process, the photo-lithography process being capable of forming areas having a predetermined minimum photolithography width, and the isolation region having a width less than the predetermined minimum photolithography width.

27. The method of claim 21 further comprising:

rounding the top corners of the lower conductive layer after removing the temporary insulation layer.

28. The method of claim 27 wherein the rounding of the top corners of the lower conductive layer comprises a thermal oxidation process and a wet oxide dip.

* * * * *